US011482966B2

(12) United States Patent
Lyford

(10) Patent No.: US 11,482,966 B2
(45) Date of Patent: Oct. 25, 2022

(54) DEVICE FOR GENERATING ELECTRIC ENERGY

(71) Applicant: Clearvue Technologies Ltd, West Perth (AU)

(72) Inventor: Jamie Lyford, West Perth (AU)

(73) Assignee: Clearvue Technologies Ltd, West Perth (AU)

(*) Notice: Subject to any disclaimer, the term of this patent is extended or adjusted under 35 U.S.C. 154(b) by 0 days.

(21) Appl. No.: 16/772,538

(22) PCT Filed: Nov. 27, 2018

(86) PCT No.: PCT/AU2018/051263
§ 371 (c)(1),
(2) Date: Jun. 12, 2020

(87) PCT Pub. No.: WO2019/119023
PCT Pub. Date: Jun. 27, 2019

(65) Prior Publication Data
US 2020/0389124 A1   Dec. 10, 2020

(30) Foreign Application Priority Data
Dec. 21, 2017 (AU) .............................. 2017905143

(51) Int. Cl.
*H02S 40/20* (2014.01)
*H02S 20/26* (2014.01)
(Continued)

(52) U.S. Cl.
CPC ............... *H02S 40/20* (2014.12); *E06B 9/24* (2013.01); *H02S 20/26* (2014.12); *H02S 30/10* (2014.12); *E06B 2009/2476* (2013.01)

(58) Field of Classification Search
CPC ............. H01L 31/055; H01L 31/02322; H01L 31/02325; H01L 31/0481; H01L 31/0488;
(Continued)

(56) References Cited

U.S. PATENT DOCUMENTS 4,357,486 A * 11/1982 Blieden ................. H01L 31/055
136/247
4,644,716 A * 2/1987 Neuroth .................... F24S 23/11
52/173.3
(Continued)

FOREIGN PATENT DOCUMENTS

CN    101904016    12/2010
EP    2200094 A2    6/2010
(Continued)

OTHER PUBLICATIONS

Machine translation of WO2014/030546A1 (Year: 2014).*
(Continued)

*Primary Examiner* — Ryan S Cannon
(74) *Attorney, Agent, or Firm* — Michael Best & Friedrich LLP

(57) ABSTRACT

The present disclosure provides device for generating electric energy. The device comprises a panel for receiving incident light. The panel is at least partially transmissive for visible light and has first and second surfaces and having a peripheral region comprising at least one edge and/or corner. The panel is arranged such that a portion of light incident on the panel is redirected within the panel towards the peripheral region of the panel. The device further comprises a flexible photovoltaic element that has first and second portions separated by a bend. The bend is located adjacent the edge or corner of the panel whereby the first and second portions of the flexible photovoltaic element are disposed with different orientations within the device.

12 Claims, 6 Drawing Sheets

(51) Int. Cl.
*H02S 30/10* (2014.01)
*E06B 9/24* (2006.01)

(58) Field of Classification Search
CPC ..... H01L 31/0547; H02S 40/36; H02S 30/20; H02S 30/10
USPC ................................................ 136/243–265
See application file for complete search history.

(56) References Cited

U.S. PATENT DOCUMENTS

| | | | |
|---|---|---|---|
| 5,760,558 A * | 6/1998 | Popat | E06B 9/32 |
| | | | 318/480 |
| 6,323,415 B1 * | 11/2001 | Uematsu | H01L 31/0543 |
| | | | 136/246 |
| 10,038,113 B1 * | 7/2018 | Nelson | H01L 31/0465 |
| 2002/0062856 A1 * | 5/2002 | Wescott | H01L 31/0547 |
| | | | 136/246 |
| 2008/0223438 A1 * | 9/2008 | Xiang | H01L 31/055 |
| | | | 136/259 |
| 2008/0314434 A1 * | 12/2008 | Khouri | H02S 30/20 |
| | | | 136/245 |
| 2009/0120488 A1 * | 5/2009 | Gorog | H01L 31/055 |
| | | | 136/247 |
| 2015/0206987 A1 * | 7/2015 | Ohhashi | H01L 31/0547 |
| | | | 136/246 |
| 2016/0204297 A1 * | 7/2016 | Vasiliev | E06B 9/24 |
| | | | 136/246 |
| 2018/0367089 A1 * | 12/2018 | Stutterheim | F24S 25/15 |

FOREIGN PATENT DOCUMENTS

| | | | | |
|---|---|---|---|---|
| KR | 1020120004264 | | 1/2012 | |
| KR | 20130083945 A | | 7/2013 | |
| KR | 20140003523 U | | 6/2014 | |
| WO | 2013003890 | | 1/2013 | |
| WO | 2013003894 | | 1/2013 | |
| WO | WO-2014030546 A1 * | | 2/2014 | ......... H01L 31/0547 |
| WO | 2015024046 | | 2/2015 | |

OTHER PUBLICATIONS

International Search Report for Application No. PCT/AU2018/051263 dated Jan. 8, 2019 (4 pages).
Chen, R.T. et al., "Design and fabrication of diffusive solar cell window," Renewable Energy, 40 (1), Apr. 2012, pp. 24-28.
Currie, M. J. et al., "High-Efficiency Organic Solar Concentrators for Photovoltaics," Science, Jul. 11, 2008, vol. 321, pp. 226-228.
Extended European Search Report for application 18893154.7, dated Aug. 25, 2021 (5 pages).

* cited by examiner

DEVICE FOR GENERATING ELECTRIC ENERGY

FIELD OF THE INVENTION

The present invention relates to a device for generating electric energy and relates particularly to a device comprising a photovoltaic element.

BACKGROUND TO THE INVENTION

Overheating of interior spaces, such as spaces that receive sunlight through large windows, is a problem that may be overcome using air conditioners. A large amount of energy is globally used to cool interior spaces. The majority of electrical energy is generated using non-sustainable sources, which is of increasing environmental concern.

PCT international applications numbers PCT/AU2012/000778 and PCT/AU2012/000787 (both owned by the present applicant) disclose a spectrally selective panel that can be used as a windowpane and is largely transmissive for visible light, but diverts a portion of incident light to side portions of the panel where it is absorbed by photovoltaic elements to generate electricity.

The present invention provides further improvements.

SUMMARY OF THE INVENTION

In a first aspect of the present invention there is provided a device for generating electric energy, the device comprising:
  a panel for receiving incident light and being at least partially transmissive for visible light, the panel having first and second surfaces and having a peripheral region comprising at least one edge and/or corner, the panel being arranged such that a portion of light incident on the panel is redirected within the panel towards the peripheral region of the panel;
  a flexible photovoltaic element comprising first and second portions separated by a bend, the bend being located adjacent the edge or corner of the panel whereby the first and second portions of the flexible photovoltaic element are disposed with different orientations within the device.

The first surface of the panel may be a receiving surface for receiving incident light.

The edge or corner of the panel may be located intermediate the first and second portions of the flexible photovoltaic element such that the bend of the flexible photovoltaic element is located at the edge and/or corner of the panel.

The first surface portion of the flexible photovoltaic element may be positioned substantially parallel to the first receiving surface of the panel and the second surface of the panel may comprise at least a portion of an edge or corner surface of the panel and may be positioned in an angular orientation relative to the first surface of the panel and wherein the second surface portion of the photovoltaic element is positioned substantially parallel to the second surface of the panel.

Alternatively, the first and second surfaces of the panel may both be edge or corner surfaces of the panel and the first surface of the panel may be located at an angle to the second surface of the panel. In this example each one of the first and second surfaces of the panel may be located at an angle and the first and second portions of the flexible photovoltaic element may be disposed substantially perpendicular to each other.

The first and second portions of the flexible photovoltaic element may also be separated by a fold line, which may be a perforation or any other line of structural weakness (such as indentations) that facilitates bending. The flexible photovoltaic element typically comprises a polymeric material, such as a flexible film of the polymeric material.

The flexible photovoltaic element may have a first area that comprises the first and second portions of the flexible photovoltaic element separated by a bend. Further, the flexible photovoltaic element may have a second area that comprises further first and second portions of the photovoltaic element that are also separated by a bend. The first area of the flexible photovoltaic element may also be separated from the second area of the flexible photovoltaic element by a bend such that the first area and the second area are disposed at an angle to one another.

The bend of the flexible photovoltaic element intermediate the first and second portions of the first area of the flexible photovoltaic element may be located at the edge between the first surface, which may be the receiving surface, and the second surface, which may be an edge surface of the panel. Alternatively, the bend of the flexible photovoltaic element may be located at the edge between a first edge surface and a second edge surface of the panel. The second surface may be substantially perpendicular to the first surface. The first portion of the first area of the flexible photovoltaic element may be located at, and/or may be substantially parallel to, the first surface of the panel, and the first portion of the second area of the flexible photovoltaic element may also be located at, and/or may be substantially parallel to, the first surface of the panel.

Further, the bend of the flexible photovoltaic element intermediate the first and second areas of the flexible photovoltaic element may be located at the corner of the panel. The second portion of the first area and also the second portion of the second area of the flexible photovoltaic element may both be located at respective second surfaces, which may be corner surfaces, of the panel and may be substantially perpendicular to the first (or receiving) surface of the panel.

The first portion of the first area and the first portion of the second area of the flexible photovoltaic element may be chamfered such that the first portions of the first and second areas of the flexible photovoltaic element are in substantial abutment when located substantially parallel the first surface of the panel.

The first area of the flexible photovoltaic element may comprise a third portion in addition to the first and surface portions. The third surface portion may be separated from the second surface portion by a bend such that the first area comprises a bend between the first and second portions and a bend between the second and third portions.

The panel may be located adjacent a frame member adapted to retain the panel in a fixed position, the frame member comprising:
  a first face extending along, and which may be substantially parallel to, a peripheral surface, such as an edge surface of the panel;
  a second face of the frame member located at the first face and extending at an angle to the first face;
  wherein the first portion of the first area of the flexible photovoltaic element extends along, and may be positioned substantially parallel to, the first or receiving surface of the panel, the second portion of the first area of the flexible photovoltaic element extends along, and may be positioned substantially parallel to, the first face of the frame member, and the third portion of the first area of the flexible photovoltaic element extends along, and may be positioned substantially parallel to, the second face of the frame member.

DETAILED DESCRIPTION OF SPECIFIC EMBODIMENTS

Referring to FIGS. 1 to 8, a device comprising a spectrally selective panel according to an embodiment of the present invention is now described.

The device 100 may for example be provided in the form of a window of a building, a sky light, a window of a car or any other structure that usually comprises windows. A person skilled in the art will appreciate that the device 100 may be applied to different structures, such as walls and roof and the like.

Figure 1:
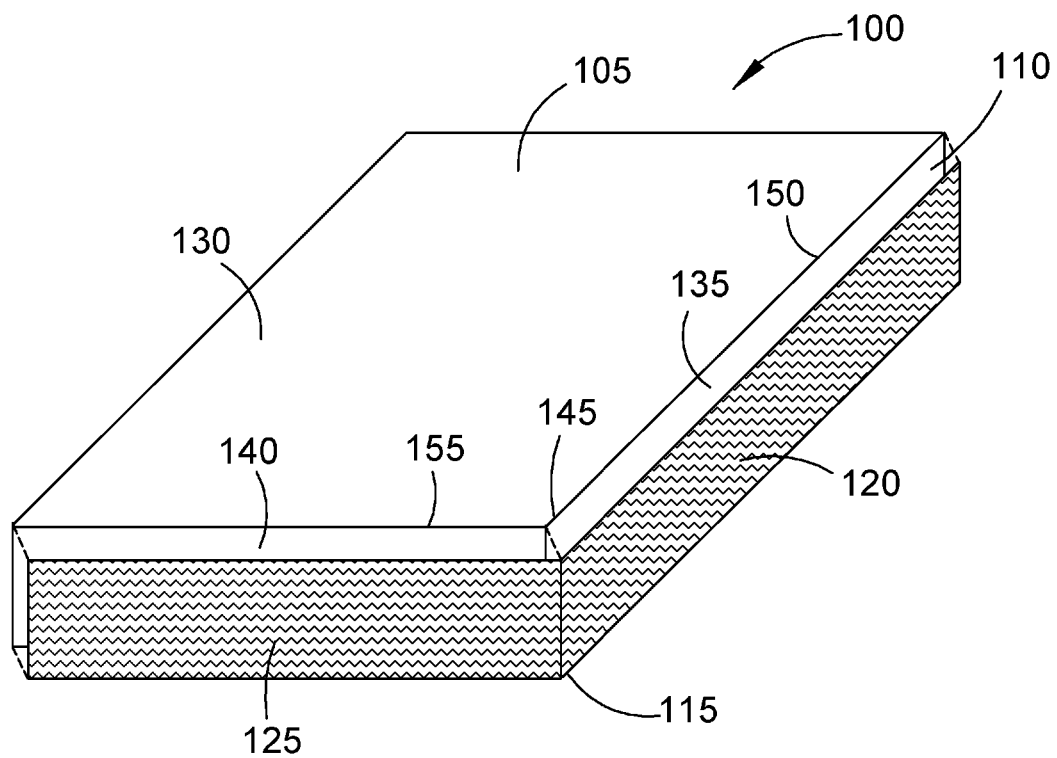
FIG. 1 is a schematic representation of a device in accordance with an embodiment of the present invention.

In the embodiment of FIG. 1 the device 100 comprises a spectrally selective panel 105 with a receiving surface 130 that receives incident light, such as sunlight. A portion of the incident light is directed within the panel to the peripheral regions of the panel 105 where it is absorbed by a photovoltaic element 110. The photovoltaic element 110 generates electricity in response to receiving the redistributed light.

The spectrally selective panel 105 is arranged such that a portion of incident infrared (IR) light is directed towards the peripheral regions or edges of the panel 105. The IR light is directed within and along the panel 105 towards an edge of the panel 105. Further, a portion of the IR light is also directed towards surfaces that are at the edges, but in front or behind the panel 105.

The spectrally selective panel 105 is arranged such that at least the majority of light within the visible wavelength range is transmitted through the panel and not directed towards the edges of the panel.

The photovoltaic elements 110 are formed so as to be flexible and are made from a suitable semi-conductor material. In one specific embodiment the photovoltaic elements 110 CIS or CIGS photovoltaic elements and comprise a multi-layered polymeric material. The multi-layered structure of the photovoltaic (CIS, CIGS, amorphous silicon, perovskite or other) element is positioned on a flexible substrate, which may for example be formed from, or comprise, a suitable polymeric material such as polyimide, a suitable fabric material, a suitable metallic material, fiberglass, a suitable fibrous material such as paper, or a suitable elastomeric material such as silicone rubber.

Various configurations of panel 105 can be employed to redistribute incident light to the peripheral regions of the panel 105, these include use of laminated glass with reflective and diffractive structures or coatings formed intermediate or on the glass panel. Further, the panels may comprise luminescent materials that absorb and emit luminescence light in an infrared wavelength range. Further details concerning the panel 105 are discloses in PCT international applications numbers PCT/AU2012/000778 and PCT/AU2012/000787 (both owned by the present applicant), which are herewith incorporated by cross-reference.

Referring now to FIG. 1 in more detail, the panel 105 comprises edge surfaces 135 and 140 located adjacent receiving surface 130. In this embodiment the panel 105 has a rectangular edge profile and the edge surfaces 135 and 140 are oriented at right angles relative to the receiving surface 130 and at right angles relative to each other (in this example). Receiving surface 130 is substantially planar (though this is not essential). The edge surfaces 135 and 140 may also be planar, or substantially planar, though this is also not essential.

When the edge surfaces 135 and 140 are substantially planar, they may be disposed within panel 105 so as to be substantially perpendicular to one another, as well as substantially perpendicular to the receiving surface 130. A corner 145 is located intermediate edges surfaces 135 and 140. An edge 150 is located intermediate receiving surface 130 and edge surface 135. In addition, a further edge 155 is located intermediate receiving surface 130 and edge surface 140.

The photovoltaic element 110 is flexible. A first portion 120 of the flexible photovoltaic element 110 is disposed adjacent to edge surface 135 of panel 105, and a second portion 125 of the flexible photovoltaic element 110 is disposed adjacent to edge surface 140 of panel 105. A bend 115 of the flexible photovoltaic element 110 is located adjacent the corner 145 of the panel 105, so that the first portion 120 and the second portion 125 of the flexible photovoltaic element 110 are disposed with different orientations within device 100. In this specific example the first portion 120 is disposed perpendicular to second portion 125.

Figure 2:
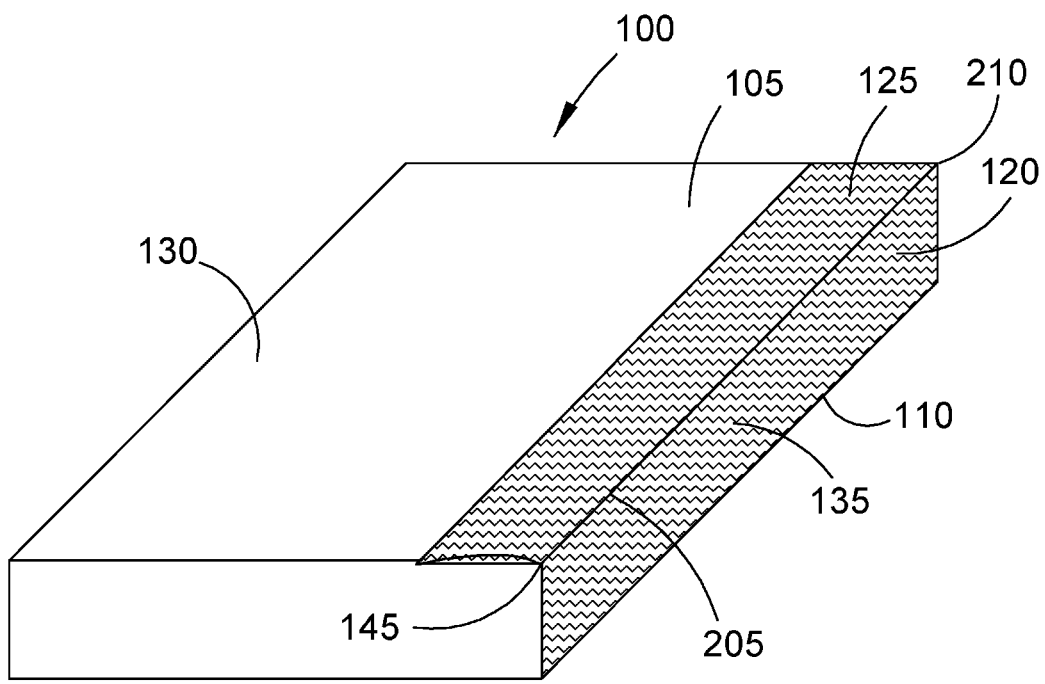
FIG. 2 is a schematic representation of a device in accordance with another embodiment of the present invention.

In the embodiment of FIG. 2, the first portion 120 of the flexible photovoltaic element 110 is located adjacent the edge surface 135 of the panel 105, and the second portion 125 is located adjacent the receiving surface 130.

A bend 205 of the flexible photovoltaic panel 105 is located adjacent to and in alignment with the corner 150 that is located intermediate the receiving surface 130 and the edge surface 135. The bend 205 enables the first portion 120 to be located adjacent the edge surface 135, and the second portion to be located adjacent the receiving surface 130. The bend also enables the first portion 120 to be disposed within the device 100 with a different orientation to the second portion 125. In this embodiment, the first portion 120 is substantially perpendicular to second portion 125.

Figure 3:
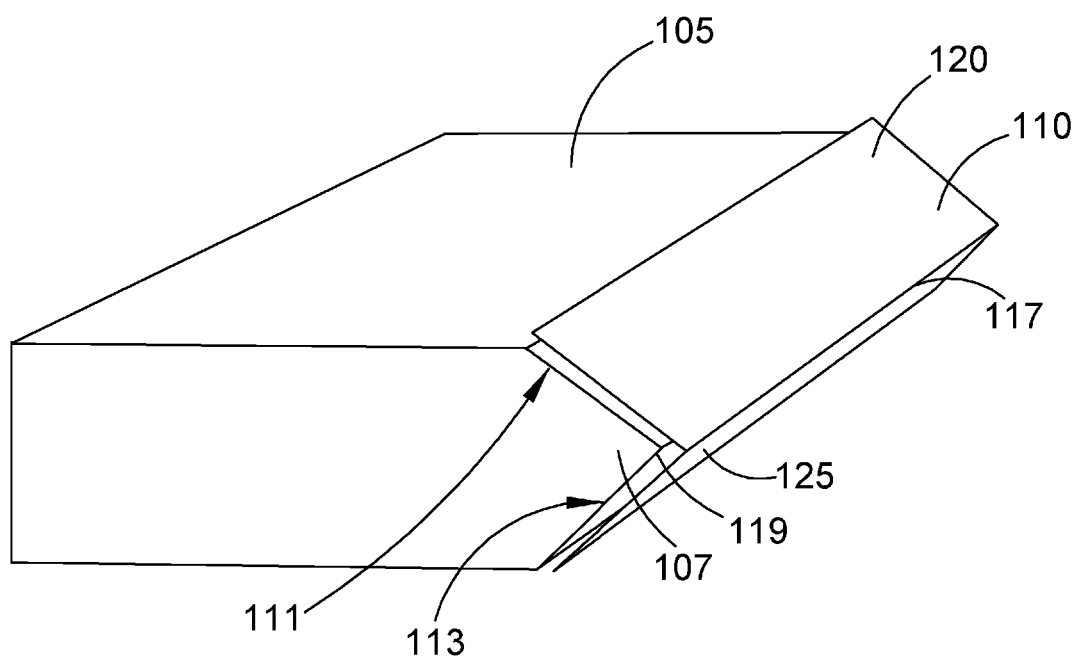
FIG. 3 is a schematic representation of a device in accordance with another embodiment of the present invention.

FIG. 3 illustrates an alternative embodiment of the present invention. In this embodiment the panel 105 has a bevelled or tapered edge 107. The panel 105 may comprise component panel portions that together form the panel 105 having the bevelled edge or tapered edge. While FIG. 3 illustrates the panel 105 having only one bevelled or tapered edge 107, the panel 105 may alternatively comprise any number of bevelled or tapered edges. One or more flexible photovoltaic elements 110 are located at the peripheral regions of the panel 105. The first portion 120 and the second portion 125 are of the flexible photovoltaic element 110 are located adjacent the edge surface 111 and 113 of the panel 105. A bend 117 of the flexible photovoltaic element 110 is located adjacent to and in alignment with the edge 119 of the panel 105.

Figure 4:
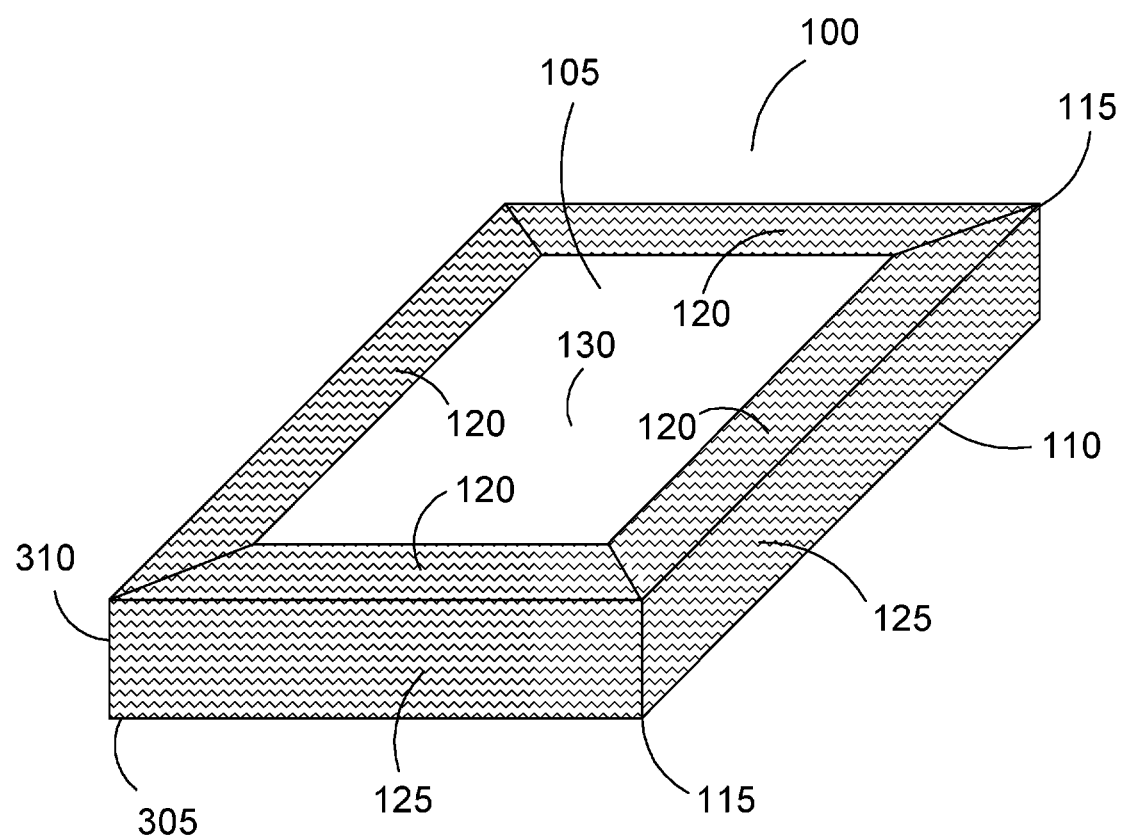
FIG. 4 is a schematic representation of a device in accordance with a further embodiment of the present invention.

The embodiment illustrated in FIG. 4 relates to the above-described embodiment of FIG. 2 as FIG. 3 also illustrates an embodiment in which the panel 105 has a rectangular edge-profile. One or more flexible photovoltaic elements 110 are located at the peripheral regions of the panel 105. In particular, a photovoltaic element is located adjacent each edge surface of panel 105 and the peripheral regions of the receiving surface 130. Corners of each of the photovoltaic elements located at the receiving surface 130 are chamfered so that adjacent photovoltaic elements within the peripheral regions of the receiving surface 130 substantially abut. This is to avoid overlapping of photovoltaic elements located in the corner regions of the receiving surface 130.

Figure 5:
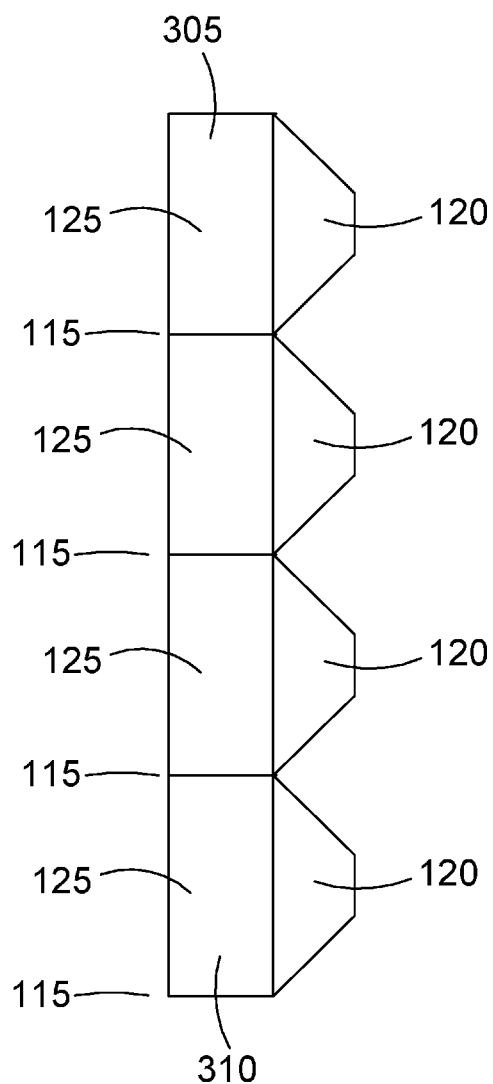
FIG. 5 is a plan view of a flexible photovoltaic element used in the device of FIG. 4.

FIG. 5 is a development of a flexible photovoltaic element that may be folded along various fold lines 405. The fold lines may be provided in the form of perforations, may be lines along which the photovoltaic element is partially cut, or may be lines of any other form of structural weakness. When the flexible photovoltaic element is folded along fold line 405 the resultant structure is able to envelop the peripheral regions of receiving surface 130 and the edge surfaces of the panel 105.

Figure 6:
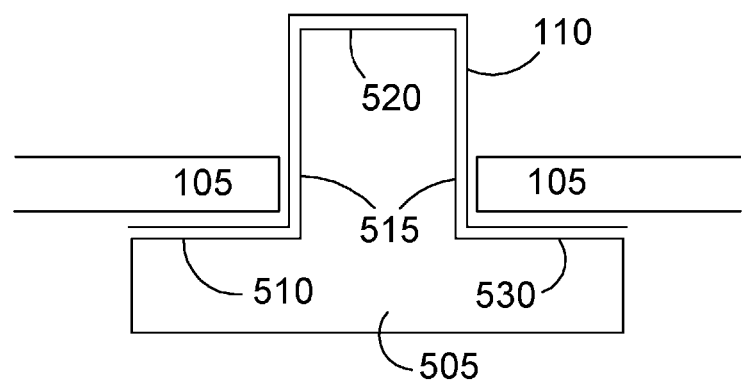
FIG. 6 is a schematic representation of an additional embodiment of the present invention.

The embodiment of FIG. 6 is a schematic representation of a frame 505 for retaining spectrally selective transmissive panels 550, 555 with at least one flexible photovoltaic element 110 that receives light redistributed to the peripheral regions of the panels 550, 555.

Frame 505 is "T" shaped in cross section, with panel 550 located on one side of the head of the "T", and panel 555 located on the opposite side of the head of the "T". The stem portion of the "T" 515 is located intermediate the two panels 550, 555. The stem 515 has a height that is greater than the thickness of the two panels 550, 555.

In this arrangement, the flexible photovoltaic panel has four bends 525, 526, 530 and 531. Bends 525, 526 are at the intersection of the head of the "T" and the stem of the "T", whereas bends 530, 531 are at the intersection of the stem of the "T" and the base of the stem 520.

Figure 7:
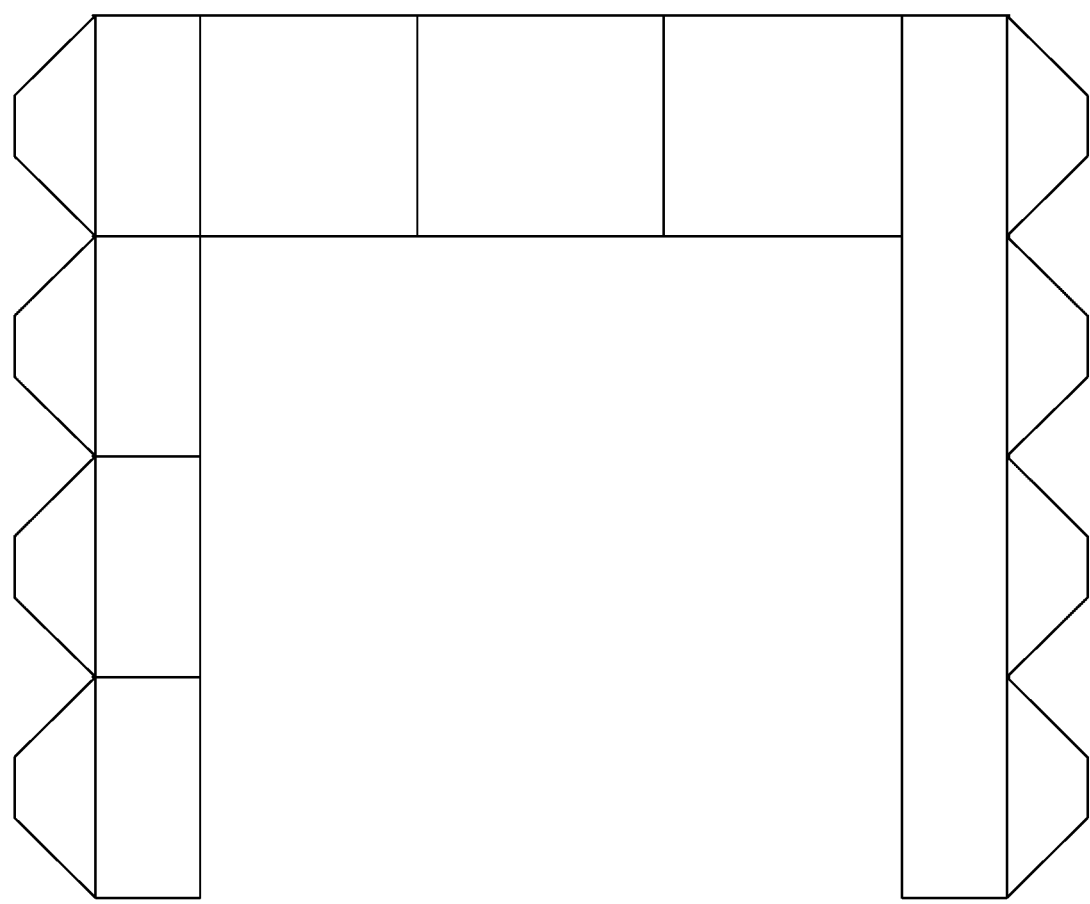
FIG. 7 is a plan view of a flexible photovoltaic element used in the device of FIG. 6.

The flexible photovoltaic elements 110 envelope the side edges and the peripheral regions of the panels 550 and 555, in a similar manner to of FIGS. 4 and 5. FIG. 7 is a development showing a single piece photovoltaic element 600 that can folded along the fold lines 601 to envelop panels 550, 555 and the outer surface of frame 550 as described above in relation to FIG. 6.

Figure 8:
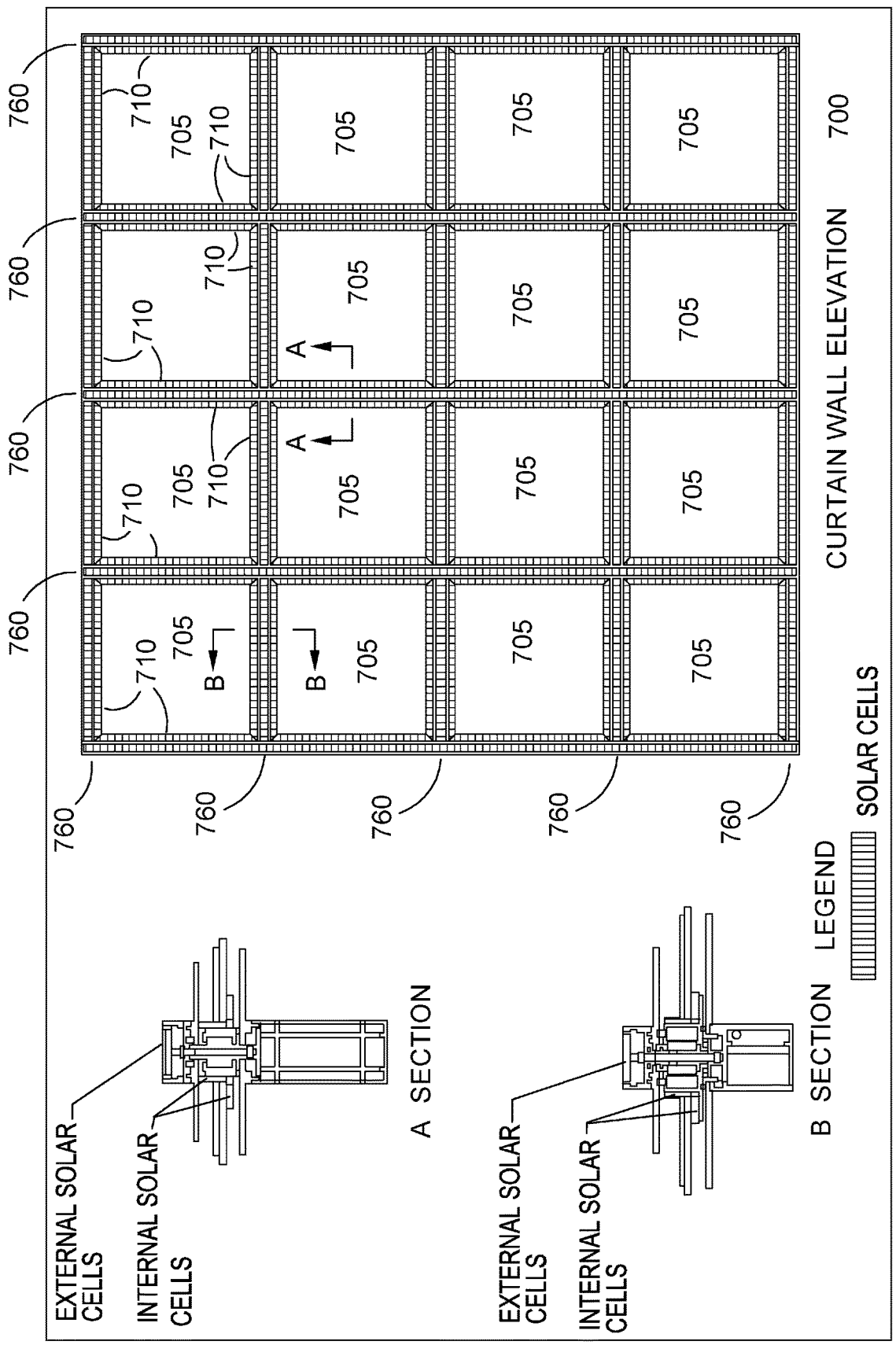
FIG. 8 is a schematic representation of a curtain wall employing any one or more of the embodiments of FIGS. 1 to 7.

FIG. 8 is a front view of a curtain wall 700 consisting of multiple spectrally selective transmissive panels 705 that are located by frame members 760. The peripheral edges of the panels 705 are enveloped by flexible photovoltaic elements 710, so that the external surface of the frame 760 is covered by a photovoltaic element, and so that photovoltaic elements are located adjacent the peripheral regions of the panels 705. A single flexible photovoltaic element may be configured so as to envelop the peripheral region of two adjacent panels, along with the intermediate frame portion. The development of FIG. 7 is an example of how a single flexible photovoltaic element may be configured to envelop two adjacent panels 705 and intermediate frame member 760.

What is claimed is:

1. A device for generating electric energy, the device comprising:

a panel for receiving incident light and being at least partially transmissive for visible light, the panel having first and second surfaces and having a peripheral region comprising at least one edge and/or corner, the panel being arranged such that a portion of light incident on the panel is redirected within the panel towards the peripheral region of the panel;

a flexible photovoltaic element comprising first and second portions separated by a bend, the bend being located adjacent the edge or corner of the panel whereby the first and second portions of the flexible photovoltaic element are disposed with different orientations within the device, wherein the first and second portions of the flexible photovoltaic element are separated by a fold line that is at the bend, wherein the first portion has a first portion edge that extends parallel to, but has a different length than, the fold line wherein the first and second portions of the flexible photovoltaic element absorb light, wherein the first surface of the panel is a receiving surface for receiving incident light, wherein the edge or corner of the panel is located intermediate the first and second portions of the flexible photovoltaic element such that the bend of the flexible photovoltaic element is located at the edge and/or corner of the panel, wherein the first and second portions of the flexible photovoltaic element are disposed along respective ones of the first and second surface of the panel, and wherein the first portion of the flexible photovoltaic element is positioned substantially parallel to the first surface of the panel, the second surface of the panel comprises at least a portion of an edge or corner surface of the panel and is substantially perpendicular to the first surface of the panel and the second portion of the photovoltaic element is positioned substantially parallel to the second surface of the panel.

2. The device as claimed in claim 1 wherein the flexible photovoltaic element has a first area that comprises the first and second portions of the photovoltaic element separated by the bend, and wherein the photovoltaic element has a second area that comprises a further first and second portion of the photovoltaic element also separated by a bend, and wherein the first area is separated from the second area by a bend in the flexible photovoltaic element such that the first area and the second area can be disposed at an angle to one another.

3. The device as claimed in claim 2 wherein the first portion of the first area of the flexible photovoltaic element is located at the first surface of the panel and the first portion of the second area of the flexible photovoltaic element is also located at the first surface of the panel.

4. The device as claimed in claim 2 wherein the second portion of the first area and also the second portion of the second area of the flexible photovoltaic element are both located at respective second surfaces of the panel and are oriented in angular orientations relative to the first surface of the panel.

5. The device as claimed in claim 2 wherein the first portion of the first area and the first portion of the second area of the flexible photovoltaic element are chamfered such that the first portions of the first and second areas of the flexible photovoltaic element are in substantial abutment when located in an angular orientation relative to the first surface of the panel.

6. The device as claimed in claim 2 wherein the first area of the flexible photovoltaic element comprises a third portion in addition to the first and second portions and wherein the third portion is separated from the second portion by a bend such that the first area comprises a bend between the first and second portions and a bend between the second and third portions.

7. The device as claimed in claim 6 wherein the panel is located adjacent a frame member adapted to retain the panel in a fixed position, the frame member comprising:
 a first face extending along, and which may be substantially parallel to, a peripheral surface;
 a second face of the frame member located at the first face and extending at an angle to the first face;
 wherein the first portion of the first area of the flexible photovoltaic element extends along, and may be positioned substantially parallel to, the first surface of the panel, the second portion of the first area of the flexible photovoltaic element extends along, and may be positioned substantially parallel to, the first face of the frame member, and the third portion of the first area of the flexible photovoltaic element extends along, and may be positioned substantially parallel to, the second face of the frame member.

8. The device as claimed in claim 1 wherein the bend of the flexible photovoltaic element is located at the edge between a first edge surface and a second edge surface of the panel.

9. The device as claimed in claim 1 wherein a bend of the flexible photovoltaic element is located at the corner of the panel.

10. The device as claimed in claim 1 wherein the fold line is a perforation.

11. The device as claimed in claim 1 wherein the fold line is a line along which the photovoltaic element is partially cut.

12. The device as claimed in claim 1 wherein the fold line is a line of structural weakness.

* * * * *